United States Patent [19]

Kling

[11] Patent Number: 4,732,560
[45] Date of Patent: Mar. 22, 1988

[54] HUMIDITY PROTECTED RADIATION-RESPONSIVE SWITCH

[75] Inventor: Michael R. Kling, White Deer, Pa.

[73] Assignee: GTE Products Corporation, Danvers, Mass.

[21] Appl. No.: 532,090

[22] Filed: Sep. 14, 1983

Related U.S. Application Data

[63] Continuation of Ser. No. 332,899, Dec. 21, 1981, abandoned.

[51] Int. Cl.$^4$ .............................................. F21K 5/00
[52] U.S. Cl. ............................... 431/359; 252/501.1; 252/520; 252/514; 525/232; 362/6; 362/13
[58] Field of Search ............... 431/359; 252/501.1, 252/514, 518, 520; 362/4, 6, 13, 14, 15; 525/227, 232

[56] References Cited

U.S. PATENT DOCUMENTS

| | | | |
|---|---|---|---|
| 3,871,887 | 3/1975 | Jones | 430/965 X |
| 3,904,802 | 9/1975 | Brown et al. | 428/914 X |
| 3,918,966 | 11/1975 | Metcalfe et al. | 427/17 X |
| 3,951,582 | 4/1976 | Holub et al. | 362/13 X |
| 3,990,832 | 11/1976 | Smialek et al. | 431/359 |
| 4,039,334 | 8/1977 | Ikenque et al. | 430/619 |
| 4,080,155 | 3/1978 | Sterling | 431/359 |
| 4,320,440 | 3/1982 | Brower et al. | 431/359 |
| 4,336,570 | 6/1982 | Brower et al. | 362/4 |
| 4,340,684 | 6/1982 | Bohm et al. | 525/232 X |
| 4,371,668 | 2/1983 | Ilzeda et al. | 525/232 X |
| 4,379,690 | 4/1983 | Kling et al. | 431/359 |

*Primary Examiner*—Samuel Scott
*Assistant Examiner*—Carl D. Price
*Attorney, Agent, or Firm*—Thomas H. Buffton

[57] ABSTRACT

A multilamp photoflash unit responsive to either a high pulse potential source or a low voltage source includes normally open (N/O) switches having a composition which includes an admixture of silver carbonate and/or silver oxide, titanium dioxide and a blended binder of polystyrene and thermoplastic.

13 Claims, 3 Drawing Figures

POTENTIAL SOURCE

HUMIDITY PROTECTED RADIATION-RESPONSIVE SWITCH

This is a continuation of application Ser. No. 332,899, filed Dec. 21, 1981 and now abandoned.

TECHNICAL FIELD

This invention relates to multiple lamp photoflash units and more particularly to multilamp photoflash units having integral humidity protected radiation-responsive switches.

BACKGROUND ART

Generally, it is common to provide multilamp photoflash units which include a plurality of flashlamps each affixed to the electrical circuit of a printed circuit board. The electrical circuit is connectable to an energizing source, which may be of the so called high voltage type having a voltage of about 2000 volts or the low voltage type wherein the voltage is in the range of about 15 volts. Also, the photoflash unit often includes a radiation-responsive normally open (N/O) switch immediately adjacent all but one lamp of the multilamp units. Each of these switches responds to radiation from a nearby lamp in a manner to provide an electrically conductive path rather than the open or non-conductive path prior to exposure to radiation from a lamp.

Of the known problems associated with the above-described normally-open switches and multilamp photoflash units, resistance to humidity and to catastrophic failure due to burn off or blow off are perhaps two of the better known. More specifically, exposure to moisture conditions tends to cause a very erratic behavior of the usual normally-open type switch due to the tendency of the silver source of the composition to prematurely convert to a low resistance value. Also, the compactness of present day photoflash units necessitates a very close spacing of the lamps or radiation source and the radiation-responsive switches. Thus, the tendency for excess radiation or blow off of the switch is of increased concern.

One known attempt to alleviate the above described himidity problems includes the coating of the switch with a moisture barrier compound, such as a lacquer, for example. However, such coating techniques add another step to the process which is obviously undesirable because of the cost in both materials and efficiency of the process.

Further, it is known that the addition of a glass bead filler to the switch composition reduces the tendency toward blow off, and such a composition is described in U.S. Pat. No. 4,080,155 of Sterling. Moreover, an improvement on the above mentioned glass bead containing composition is disclosed in a co-pending application bearing U.S. Ser. No. 021,398, filed Mar. 19, 1979, and assigned to the present assignee. Therein, a filler material such as aluminum dioxide or titanium dioxide is added to the composition in order to inhibit undesired blow off.

Although the above described humidity and blow off procedures have been known, it is obvious that an added step to a process in order to provide moisture control is undesirable. Also, the above described addition of a filler material has only been referred to in connection with a high voltage type discharge device wherein a pulse potential having a limited direction is employed.

SUMMARY OF THE INVENTION

An object of the present invention is to provide an enhanced multilamp photoflash unit. Another object of the invention is to provide an enhanced photoflash unit having improved switching capability. Still another object of the invention is to provide an improved switch for a multilamp photoflash array. A further object of the invention is to provide an improved switch having increased resistance to moisture and blow off and suitable to a multilamp photoflash unit.

These and other objects, advantages and capabilities are achieved in one aspect of the invention by a multilamp photoflash unit having at least one humidity protected radiation-responsive switch which includes an admixture of silver carbonate and/or silver oxide, a filler material and a binder of blended polystyrene and a butadiene styrene copolymer.

In another aspect of the invention, a normally open (N/O) switch for a multilamp photoflash unit includes an admixture of silver carbonate and/or silver oxide, titanium dioxide and a blended binder of polystyrene and a butadiene styrene copolymer.

BEST MODE FOR CARRYING OUT THE INVENTION

For a better understanding of the present invention, together with other and further advantages and capabilities thereof, reference is made to the following disclosure and appended claims in conjunctin with the accompanying drawings.

Figure 1:
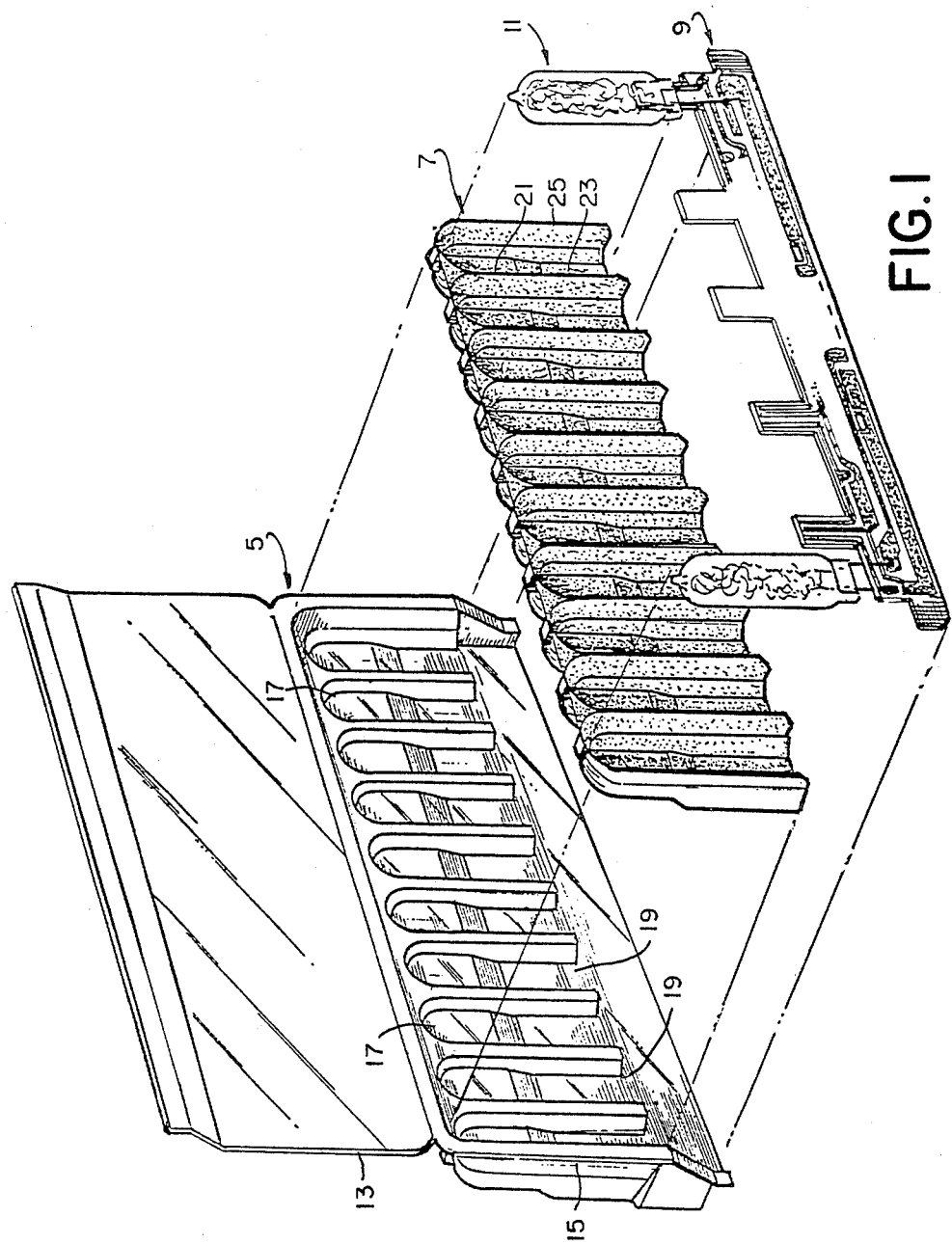
FIG. 1 is an exploded view of a preferred form of multilamp photoflash unit of the invention.

Referring to FIG. 1 of the drawings, a multilamp photoflash unit includes a plastic housing member 5, a reflector unit 7, a printed circuit board 9 and a plurality of photoflash lamps 11. The photoflash lamps 11 and the printed circuit board 9 are formed to be received by the reflector unit 7 and the reflector unit 7, in turn, is formed for positioning within the plastic housing member 5.

In greater detail, the plastic housing member 5 includes a light transmittable front portion 13 foldably connected to a back portion 15. The back portion 15 has a plurality of spaced cavities 17, and each of the cavities 17 includes an offset portion 19. The reflector unit 7 also includes a plurality of spaced cavities 21 each having an offset 23 and a reflective surface 25 on the surface of the spaced cavities 21. Also, the reflector unit 7 is formed for positional location within the cavities 19 of the back portion 15 of the plastic housing member 5.

The printed circuit board 9 includes an electrically conductive printed circuit 27 thereon with the flashlamps 11 affixed to the printed circuit 27. Also, the printed circuit board 9 includes a number of upstanding members 29 which are formed for positioning within the offset portion 23 of the cavities 21 of the reflector unit 7. The flashlamps 11 are located within the cavities 21 of the reflector unit.

Additionally, each of the upstanding members 29 of the printed circuit board 9 includes several conductive portions 31 of the printed circuit 27. These conductive portions 31 of the printed circuit 27 on each of the upstanding members 29 are overlayed with a normally open (N/O) switch composition 33.

Figure 2:
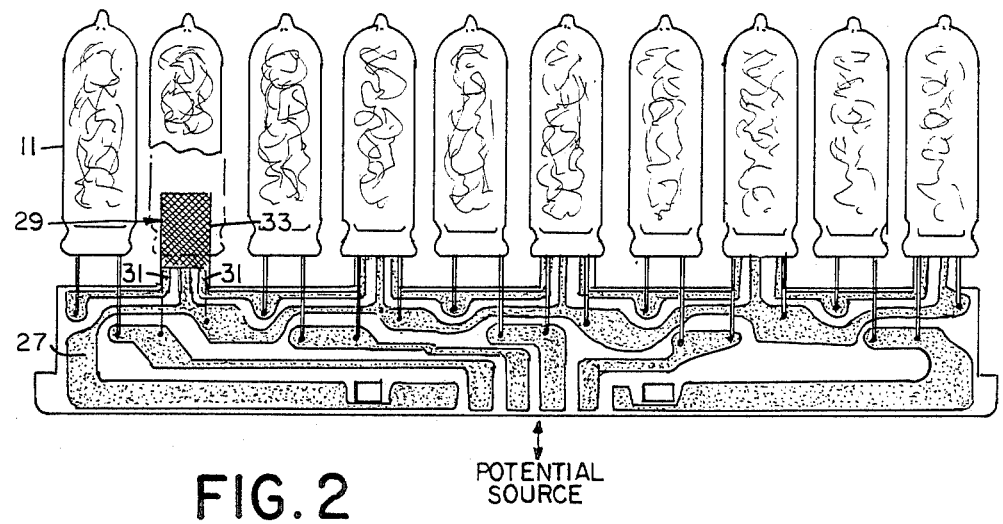
FIG. 2 is a more detailed illustration of the printed circuit board of the photoflash unit of FIG. 1.
Figure 3:
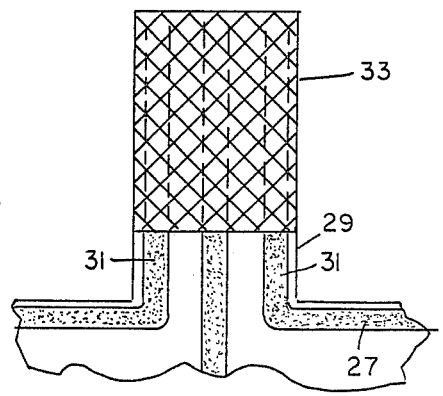
FIG. 3 is an enlarged illustration of a radiation-responsive switch of the printed circuit board of FIG. 2.

As can more readily be seen in the illustrations of FIGS. 2 and 3, the printed circuit 27 is formed for connection with each of the flashlamps 11 and for connection to a potential source within a camera (not shown). Also, the printed ciruit 27 has a plurality of upstanding portions 29, and each has conductive portions 31 theron which are overlayed with a swich composition 33 to provide a non-conductive path prior to radiation exposure and an electrically conductive path between the electrically conductive portions 31 after exposure to radiation from an adjacent flashlamp 11.

As to the humidity protected radiation-responsive switch, a preferred admixture includes silver carbonate and/or silver oxide in conjunction with a filler material such as titanium dioxide and a blended binder of polystyrene and thermoplastic materials. The admixture may also include silver coated glass beads as well as a wetting agent.

Although titanium dioxide is a preferred filler material, other suitable filler materials would be aluminum dioxide, aluminum phosphate and silicon dioxide. Also, the thermoplastic binder material may be a butadiene styrene copolymer and preferred material is a butadiene copolymer known as Pliolite S-5D manufactured by the Goodyear Rubber Products Co. of Newark, N.J.

More specifically, a switch composition suitable for use in a multilamp photoflash unit energized by a high voltage source, such as a 2000-volt pulse voltage source, for example, would include an admixture of about 25% silver carbonate, 25% silver oxide, 15% silver-coated glass beads, 29% titanium dioxide and a 5% blended binder of polystyrene and pliolite S-5D in a 50-50 mixture. A switch for a multilamp photoflash unit energized by a low voltage source, a 15-volt source for example, would include about 48% silver carbonate and/or oxide, 40% silver coated glass beads, 2% titanium dioxide and 10% blended binder of 50-50 polystyrene and pliolite S-5D. Moreover, the unit energized from a low voltage source may include glass beads in the range of about 5 to 60% with the titanium dioxide in the range of about 1 to 10%.

Although the mechanism is not completely understood, it has been found that a synergistic effect is achieved when a blended binder such as butadiene styrene copolymer is utilized in conjunction with titanium dioxide. The result is a switch having a resistance to humidity which is believed to be greater than previously obtained. Moreover, the added filler material enhances the resistance of the switch to undersired burn off or blow off.

As an example of the enhanced results obtainable with the above described low voltage and high voltage multilamp photoflash units detailed above, the above described low voltage units were placed in an oven at a temperature of 120° C. and a relative humidity of 96% for 14 days along with a control test wherein polystyrene alone was the binder material. Similarly, high voltage units as described above, along with a control of units containing only polystyrene as a binder, were placed in the same oven for 53 days.

The low voltage units were tested for resistance after having been heated as described above with the following result:
Test: 19 M-ohm mean resistance
Control: 72 ohm mean resistance Thus, it can be seen that the resistance of the multilamp photoflash units operable from a low voltage source and including the blended binder maintain a resistance value which is much higher than the resistance of the units with a binder of polystyrene.

Also, the high voltage test and control units were compared for high voltage breakdown after having been heated as described above with the following result:
Test: 1700 V mean breakdown voltage
Control: 300 V mean breakdown voltage Again, it can be seen that the test units employing a blended binder as described above have a much higher breakdown voltage than the control group employing a polystyrene binder. Thus, it can readily be seen that a relatively high value of breakdown voltage is obtainable even under adverse humidity conditions when a switch of the previously described composition is utilized in a high voltage responsive multilamp photoflash unit.

While there has been shown and described what is at present considered the preferred embodiments of the invention, it will be obvious to those skilled in the art that various changes and modifications may be made therein without departing from the invention as defined by the appended claims.

INDUSTRIAL APPLICABILITY

Enhanced multilamp photoflash units responsive to a high voltage pulse source or a low potential source includes normally open (N/O) switches having a composition which includes titanium dioxide and a blended binder of polystyrene and a butadiene styrene copolymer.

The enhanced photoflash units provide a greatly improved resistance to humidity as well as an improved resistance to undesired blow off. Moreover, the combined titanium dioxide filler material and blended binder material are equally applicable for use in both high voltage and low voltage responsive photoflash units.

What is claimed is:

1. A humidity protected radiation-responsive switch for a photoflash unit comprising an admixture of silver carbonate and/or silver oxide, titanium dioxide and a binder of blended polystyrene and a butadiene styrene copolymer.

2. The humidity protected radiation-responsive switch of claim 1 wherein said blended polystyrene and butadiene styrene copolymer are in the order of about 50-50.

3. The humidity protected radiation-responsive switch of claim 1 wherein said photoflash unit is operable from a high voltage source in the order of 2000 volts, and said titanium dioxide is in the range of about 25 to 60% dried weight.

4. The humidity protected radiation-responsive switch of claim 1 wherein said photoflash unit is operable from a low voltage source in the order of about 15 volts, and said titanium dioxide is in the range of about 1 to 10% dried weight.

5. The humidity protected radiation-responsive switch of claim 1 wherein said photoflash unit is operable from a low voltage source in the order of about 15 volts, and said admixture includes titanium dioxide in the range of about 1 to 10% dried weight and silver-coated glass beads in the range of about 5 to 60% by dried weight.

6. The humidity protected radiation-responsive switch of claim 1 wherein said photoflash unit is operable from a high voltage source, and said admixture includes about 25% silver oxide, 25% silver carbonate, 29% titanium dioxide, 15% silver-coated glass beads, 5% binder of blended polystyrene and thermoplastic and 1% wetting agent.

7. The humidity protected radiation-responsive switch of claim 1 wherein said photoflash unit is operable from a low voltage source, and said admixture includes about 48% silver oxide, 40% silver-coated glass beads, 2% titanium dioxide and 10% binder of blended polystyrene and butadiene styrene copolymer material.

8. A photoflash unit comprising a plurality of flashlamps, an electrical circuit connected to said flashlamps and to an energizing source, and radiation-responsive humidity protected switches located external and adjacent said flashlamps and responsive to radiation therefrom and characterized by the improvement wherein said switches each include an admixture of silver carbonate and/or silver oxide, titanium dioxide and a binder of a polystyrene and butadiene styrene copolymer blend.

9. The photoflash unit of claim 8 wherein said polystyrene and butadine styrene copolymer blend are in a 50-50 ratio.

10. the photoflash unit of claim 11 wherein said energizing source is a high voltage source of the order of about 2000 volts, and said titanium dioxide is in the range of about 25 to 65% by dried weight.

11. The photoflash unit of claim 8 wherein said energizing source is a low voltage source of the order of about 15 volts, and said titanium dioxide is in the range of about 1 to 10% by dried weight.

12. The photoflash unit of claim 8 wherein said energizing source is a low voltage source, and said admixture includes silver-coated glass beads in the range of about 5 to 60% by dried weight and titanium dioxide in the range of about 1 to 10% by dried weight.

13. The photoflash unit of claim 8 wherein said energizing source is a low voltage source and said admixture includes about 48% silver oxide, 40% silver-coated glass beads, 2% titanium dioxide and 10% of a 50-50 blend of a polystyrene and a butadine styrene copolymer.

* * * * *